United States Patent
Lin et al.

(10) Patent No.: US 8,937,333 B2
(45) Date of Patent: Jan. 20, 2015

(54) WHITE ORGANIC LIGHT-EMITTING DIODE

(75) Inventors: Chun-Liang Lin, Hsin-Chu (TW);
Chieh-Wei Chen, Hsin-Chu (TW);
Chung-Chun Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 463 days.

(21) Appl. No.: 12/883,118

(22) Filed: Sep. 15, 2010

(65) Prior Publication Data

US 2011/0233600 A1  Sep. 29, 2011

(30) Foreign Application Priority Data

Mar. 24, 2010 (TW) ................................ 99108702 A

(51) Int. Cl.
*H01L 33/00* (2010.01)
*H01L 27/32* (2006.01)

(52) U.S. Cl.
CPC .................................. *H01L 27/3209* (2013.01)
USPC ........ 257/99; 257/102; 257/103; 257/E51.001

(58) Field of Classification Search
USPC ............. 257/99, 102, 103, E51.001; 428/690
See application file for complete search history.

(56) References Cited

U.S. PATENT DOCUMENTS

| 5,703,436 | A | | 12/1997 | Forrest |
| 5,707,745 | A | | 1/1998 | Forrest |
| 5,757,139 | A | | 5/1998 | Forrest |
| 5,837,391 | A | * | 11/1998 | Utsugi ........................ 428/690 |
| 5,932,895 | A | | 8/1999 | Shen |
| 6,166,489 | A | | 12/2000 | Thompson |
| 7,202,506 | B1 | | 4/2007 | DenBaars |
| 2002/0122144 | A1 | * | 9/2002 | Yoshida et al. ................. 349/61 |
| 2002/0153243 | A1 | * | 10/2002 | Forrest et al. ............ 204/192.26 |
| 2006/0188745 | A1 | | 8/2006 | Liao |
| 2011/0085325 | A1 | | 4/2011 | Lecloux |

FOREIGN PATENT DOCUMENTS

TW 201010157 3/2010

* cited by examiner

*Primary Examiner* — Dale E Page
(74) *Attorney, Agent, or Firm* — Winston Hsu; Scott Margo

(57) ABSTRACT

A white organic light-emitting diode (WOLED) includes a transparent electrode, a blue-complementary light-emitting layer, a translucent electrode, a blue light-emitting layer, and a non-transparent electrode. The blue-complementary light-emitting layer is disposed on the transparent electrode. The transparent electrode and the translucent electrode include a first voltage. The blue light-emitting layer is disposed on the translucent layer. The non-transparent electrode is disposed on the blue light-emitting layer. The translucent electrode and the non-transparent electrode include a second voltage.

25 Claims, 5 Drawing Sheets

WHITE ORGANIC LIGHT-EMITTING DIODE

BACKGROUND OF THE INVENTION

1. Field of the Invention

The present invention relates to a white organic light-emitting diode, and more particularly, to a color-tunable white organic light-emitting diode including a blue light light-emitting layer and a blue-complementary light-emitting layer which can be driven separately.

2. Description of the Prior Art

Due to the high luminescence efficiency, the absence of mercury (Hg) and the property of flat light source, the organic light-emitting diodes (OLED) have been widely used in LCD backlight source and the organic light-emitting diode display panels. In conventional white organic light-emitting diodes (WOLED), the blue light-emitting material is usually declining faster than the green light-emitting material and the red light-emitting material. As a result, as the operation time of the WOLED increases, the color temperature of the WOLED will shift to yellow light due to the decline of the blue light. Consequently, the application of conventional WOLED is limited.

SUMMARY OF THE INVENTION

One objective of the present invention is to provide a color tunable WOLED including a blue light-emitting layer and a blue-complementary light-emitting layer that can be driven separately, so as to solve the problem of color temperature shifting in conventional WOLEDs.

One preferred embodiment in the present invention provides a WOLED disposed on a substrate. The WOLED includes a transparent electrode, a red-green light emitting layer, a translucent layer, a blue light-emitting layer and a non-transparent layer. The red-green light-emitting layer is disposed on the transparent electrode. The translucent electrode is disposed on the red-green light emitting layer. A first voltage is applied between the translucent electrode and the red-green light emitting layer. The blue light-emitting layer is disposed on the translucent layer. The non-transparent electrode is disposed on the blue light-emitting layer. A second voltage is applied between the translucent electrode and the non-transparent electrode.

Another preferred embodiment in the present invention provides a WOLED disposed on a substrate. The WOLED includes a transparent electrode, a blue-complementary light-emitting layer, a translucent electrode, a blue light-emitting layer, and a non-transparent electrode. The blue-complementary light-emitting layer is disposed on the transparent electrode. A first voltage is applied between the transparent electrode and the translucent electrode. The blue light-emitting layer is disposed on the translucent layer. The non-transparent electrode is disposed on the blue light-emitting layer. A second voltage is applied between the translucent electrode and the non-transparent electrode.

The WOLED in the present invention uses different driving currents to drive the blue light-emitting diode and the blue-complementary light-emitting diode separately. By using different driving currents to separately drive the blue light-emitting diode and the blue-complementary light-emitting diode, the light emitting output of the blue light-emitting diode and the blue-complementary light-emitting diode can be optimized and the color temperature of the WOLED can be tunable, thereby solving the problem of color temperature shifting in conventional WOLEDs and thus improving the application of the WOLEDs.

These and other objectives of the present invention will no doubt become obvious to those of ordinary skill in the art after reading the following detailed description of the preferred embodiment that is illustrated in the various FIG.s and drawings.

DETAILED DESCRIPTION

To provide a better understanding of the presented invention, preferred embodiments will be made in details. The preferred embodiments of the present invention are illustrated in the accompanying drawings with numbered elements.

Figure 1:
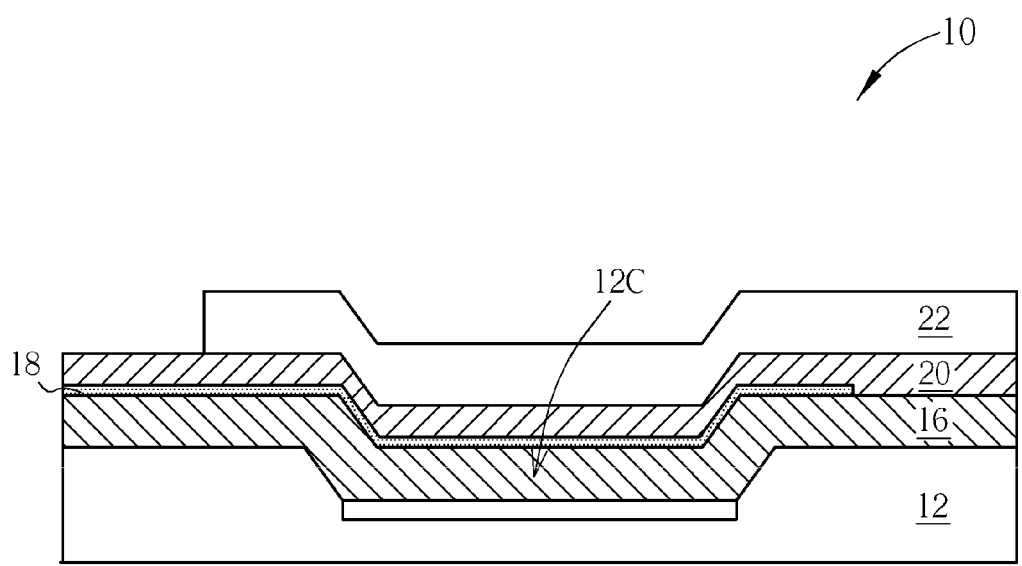
FIG. 1 illustrates a schematic diagram of the WOLED according to the first embodiment of the present invention.
Figure 2:
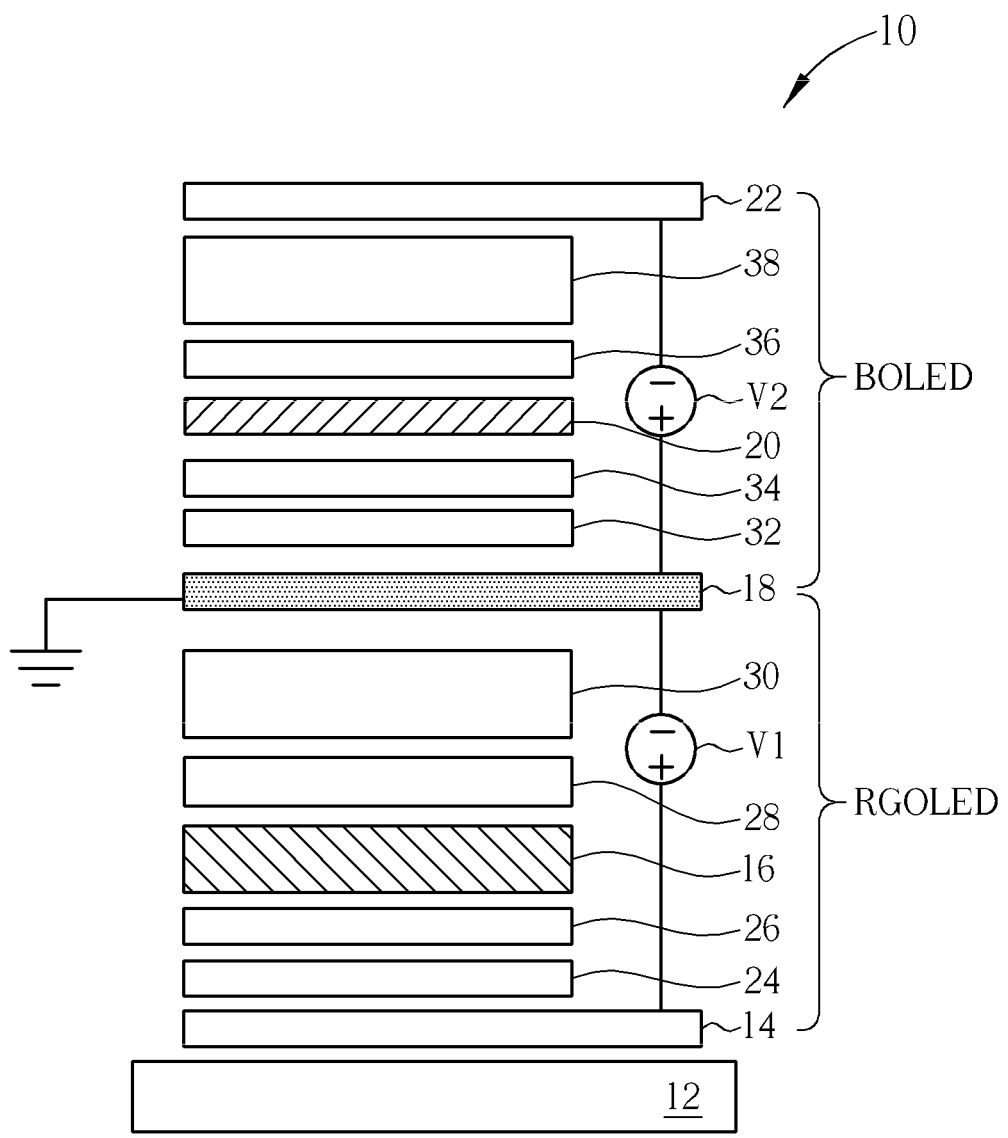
FIG. 2 illustrates a schematic diagram of the lamination structure of the WOLED according to the first embodiment of the present invention.

Please refer to FIG. 1 and FIG. 2. FIG. 1 illustrates a schematic diagram of the WOLED according to the first embodiment of the present invention. FIG. 2 illustrates a schematic diagram of the lamination structure of the WOLED according to the first embodiment of the present invention. To explain more clearly, some layer structures of the WOLED, such as the hole injection layer, the hole transmission layer, the hole blocking layer and the electron injection layer are omitted in FIG. 1, and the concave of the substrate is omitted in FIG. 2. As shown in FIG. 1 and FIG. 2, the WOLED 10 in the present embodiment is disposed on a substrate 12. The substrate 12 may include a concave 12C. The WOLED 10 includes a transparent electrode 14 which is formed on the substrate 12 and substantially corresponding to the concave 12C, a blue-complementary light-emitting layer 16 formed on the transparent electrode 14, a translucent electrode 18 formed on the blue-complementary light-emitting layer 16, a blue light-emitting layer 20 formed on the translucent electrode 18, and a non-transparent electrode 22 formed on the blue light-emitting layer 20. In the present embodiment, the blue-complementary light-emitting layer 16 is a red-green light-emitting layer, for example, a stack layer of a red light-emitting layer and a green light-emitting layer or a mixed layer of a red light-emitting layer and a green light-emitting layer, which has two wavelength peaks of luminescence corresponding to red light and green light. Accordingly, the transparent electrode 14, the blue-complementary light-emitting layer 16 and the translucent electrode 18 together form a red-green organic light-emitting diode (RGOLED), while the translucent electrode 18, the blue light-emitting layer 20 and the non-transparent electrode 22 together form a blue organic light-emitting diode (BOLED) stacked on the RGOLED. The blue light and the red-green light can therefore be mixed to form the white light. In the present embodiment, the substrate 12 is the light-emitting surface of the WOLED 10. The substrate 12 can be a transparent substrate while the non-transparent electrode 22 can include highly reflective conductive material in order to increase the light utilization efficiency. The transparent electrode 14 can include transparent conductive material, such as indium tin oxide, indium zinc oxide or aluminum zinc oxide. The non-transparent electrode 22 can include metal, such as silver, copper, aluminum, titanium, molybdenum or gold, but should not be limited thereto. The translucent electrode 18 is in a state of semi-transparency and has good lateral conductivity. The translucent electrode 18 in the concave 12C of the substrate 12 can help the BOLED disposed thereabove to form an optical micro-cavity between the translucent electrode 18 and the non-transparent electrode 22 and thus suppress or reduces the output light with wavelength near the blue light that is emitted from the RGOLED, thereby avoiding the output light interference between the BOLED and the RGOLED. In the present embodiment, the translucent electrode 18 includes metal, such as silver, aluminum, gold, magnesium, or the combinations thereof. The thickness of the translucent electrode 18 is substantially between 10 nanometers (nm) and 40 nm. The sheet resistance of the translucent electrode 18 is substantially between 0.1 ohm ($\Omega$)/square and 10 $\Omega$/square. However, the material, the thickness or the sheet resistance of the translucent electrode 18 can be adjusted according to different requirements, which should not be limited thereto. The present embodiment shows the light is bottom-emitted downwardly corresponding to the substrate 12. In another embodiment, the WOLED 10 can be configured reversely and the non-transparent electrode 22 can be disposed on the substrate 12, thereby making the light up-emitted upwardly corresponding to the substrate 12.

In addition, in order to enhance the luminescence efficiency, the WOLED 10 in the present embodiment can optionally include a hole injection layer (HIL) 24 and a hole transmission layer (HTL) 26 formed between the transparent electrode 14 and the blue-complementary light-emitting layer 16, a hole blocking layer (HBL) 28 and an electron injection layer (EIL) 30 formed between the translucent electrode 18 and the blue-complementary light-emitting layer 16, another hole injection layer 32 and another hole transmission layer 34 formed between the translucent electrode 18 and the blue light-emitting layer 20, and another hole blocking layer 36 and another electron injection layer 38 formed between the non-transparent electrode layer 22 and the blue light-emitting layer 20, as shown in FIG. 2.

In the present embodiment, the transparent electrode 14 is used as an anode, the non-transparent electrode 22 is used as a cathode and the translucent electrode 18 is grounding. By doing this, a first voltage V1 is provided between the transparent electrode 14 and the translucent electrode 18, and a second voltage V2 is provided between the translucent electrode 18 and the non-transparent electrode 22. The first voltage V1 is independent from the second voltage V2. When the WOLED 10 is emitting light, the first voltage V1 can be different from the second voltage V2. The first voltage V1 can drive the blue-complementary light-emitting layer 16 and the second voltage V2 can drive the blue light-emitting layer 20. In this way, different driving currents can be supplied individually to the blue-complementary light-emitting layer 16 and the blue light-emitting layer 20 by separately adjusting the first voltage V1 and the second voltage V2, thereby optimizing the light output of the BOLED and the RGOLED and controlling the color temperature (CCT) of the WOLED 10. In the present embodiment, the blue-complementary light-emitting layer 16 can emit a red-green light which includes a maximum intensity light whose wavelength is substantially greater than 490 nm, but is not limited thereto. The blue light-emitting layer 20 may emit a blue light which includes a maximum intensity light whose wavelength is substantially between 400 nm and 480 nm, but is not limited thereto. The thickness of the blue light-emitting layer 20 is substantially less than 120 nm, but is not limited thereto. In the abovementioned wavelength range, the blue light emitted by the blue light-emitting layer 20 and the red-green light emitted by the blue-complementary light-emitting layer 16 can be mixed to form the white light. It is noted that, since the color temperatures of the blue-complementary light-emitting layer 16 and the blue light emitting layer 20 can be controlled separately by adjusting the first voltage V1 and the second voltage V2, it provides a wider range for the WOLED 10 in the present invention when adjusting the color temperature. Besides, as the blue light-emitting layer 20 declines faster than the blue-complementary light-emitting layer 16, when the blue light-emitting layer 20 starts to decline and affects the overall color temperature of the WOLED 10, the second voltage V2 or the driving current of the blue light-emitting layer 20 can adjusted to compensate for the color temperature of the blue light emitting layer 20, thereby maintaining the overall color temperature of the WOLED 10 and elongating the life of the WOLED 10. The blue light-emitting layer 20 is preferably disposed between the translucent electrode 18 and the non-transparent electrode 22 to prevent light depression of the red-green light. If the blue-complementary light-emitting layer 16, i.e. the red-green light-emitting layer, is disposed between translucent electrode 18 and the non-transparent electrode 22, the red-green light emitted by the blue-complementary light-emitting layer 16 would be depressed by the concave 12C.

Figure 3:
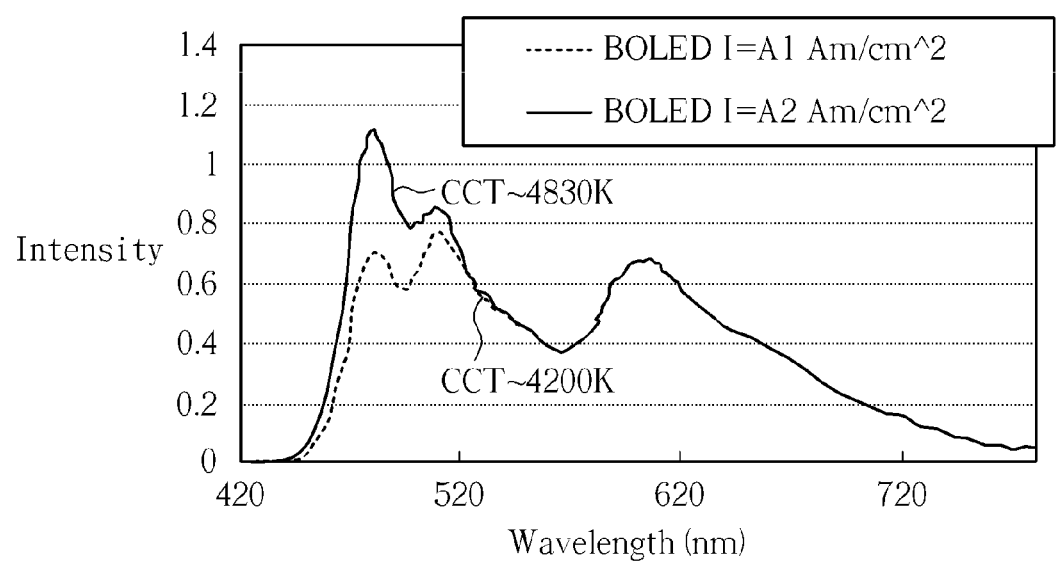
FIG. 3 illustrates a relationship diagram of the color temperature, the intensity and the wavelength of the blue light-emitting layer in the WOLED shown in FIG. 1 and FIG. 2.

Please refer to FIG. 3, and also refer to FIG. 1 and FIG. 2. FIG. 3 illustrates a relationship diagram of the color temperature, the intensity and the wavelength of the blue light-emitting layer in the WOLED shown in FIG. 1 and FIG. 2. As shown in FIG. 3, when the driving current of the blue light-emitting layer is A1 (I=A1 Am/cm$^2$), the color temperature of the blue light-emitting layer is about 4200 K. When the driving current of the blue light-emitting layer is A2 (I=Am/cm$^2$) (A2>A1), the color temperature of the blue light-emitting layer is about 4380 K. It is understood that, by controlling the second voltage V2 or the driving current of the blue light-emitting layer 20, the color temperature of the blue light emitting layer 20 can be adjusted, as well as the color temperature of the WOLED.

Figure 4:
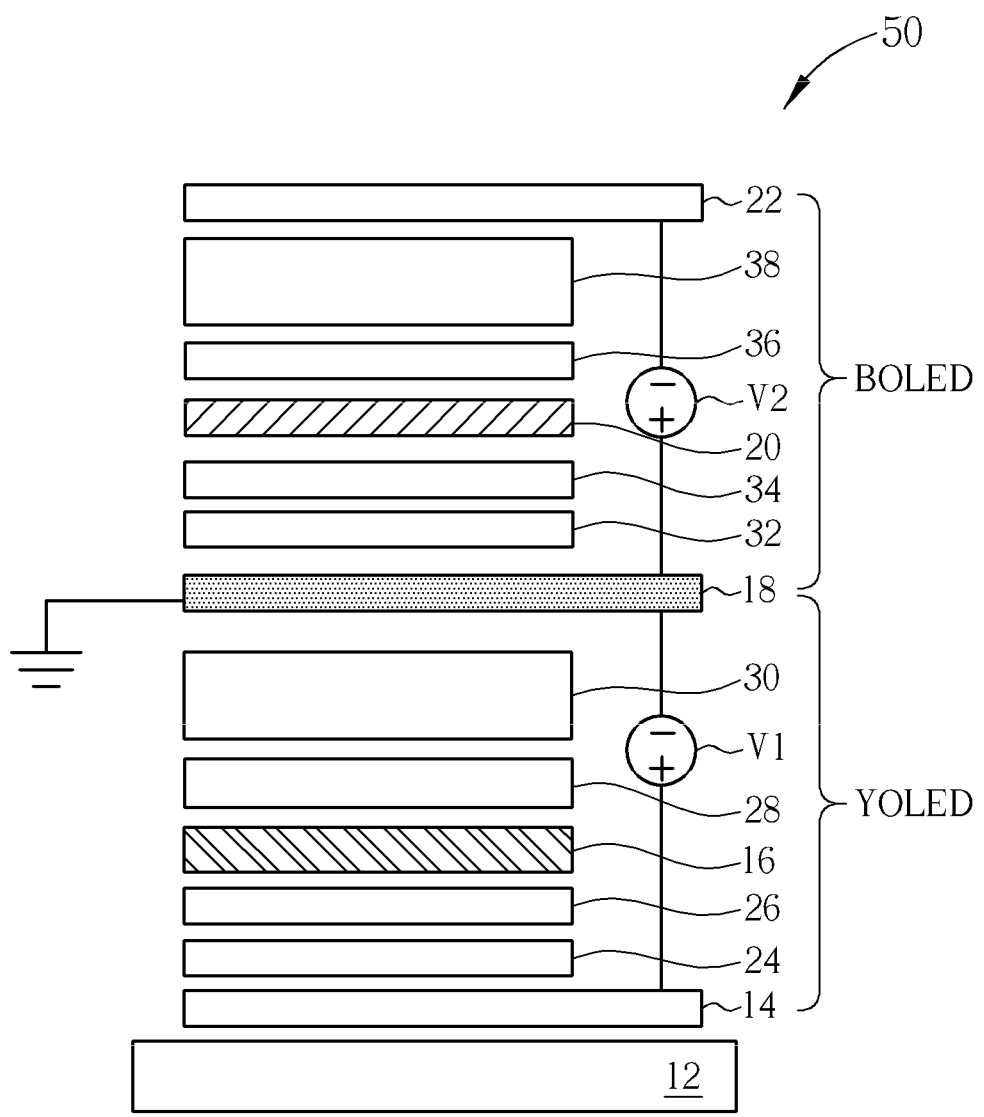
FIG. 4 illustrates a schematic diagram of the WOLED according to the second embodiment of the present invention.

Please refer to FIG. 4. FIG. 4 illustrates the schematic diagram of the WOLED according to the second embodiment of the present invention. To compare the differences between each embodiment and to simplify the description, same numerals for same components are used as in the aforementioned embodiment and detailed descriptions are not repeated. As shown in FIG. 4, compared with the previous embodiment, the blue-complementary light-emitting layer 16 of the WOLED 50 is a yellow light-emitting layer, rather than a red-green light-emitting layer. The transparent electrode 14, the yellow light-emitting layer and the translucent electrode 18 together form a yellow organic light-emitting diode (YOLED), while the translucent electrode 18, the blue light-emitting layer 20 and the non-transparent electrode 22 together form a BOLED stacked above the YOLED, making the blue light and yellow light mixed to form the white light.

Figure 5:
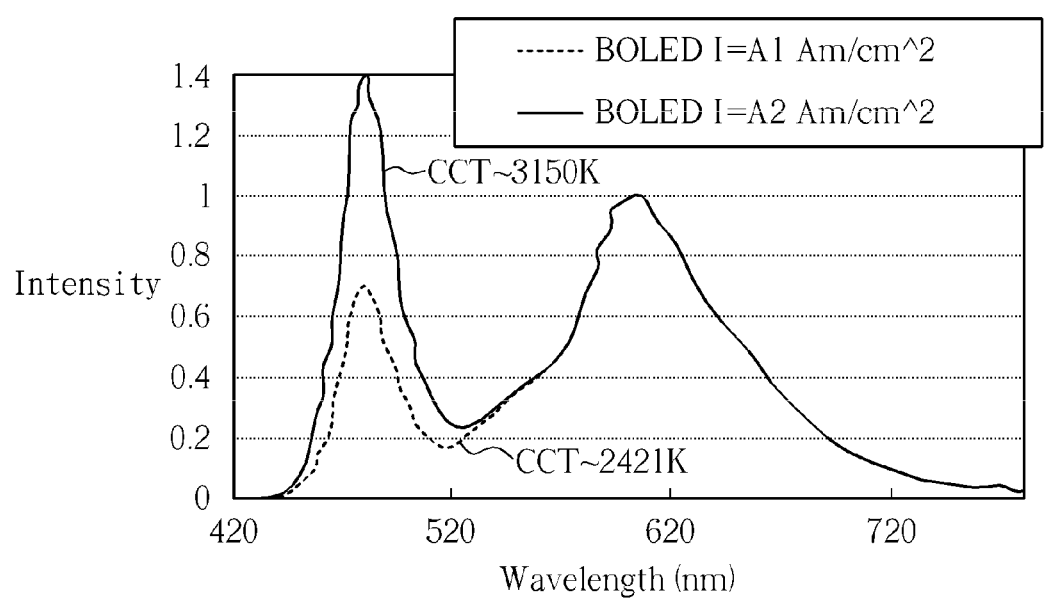
FIG. 5 illustrates a relationship diagram of the color temperature, the intensity and the wavelength of the blue light-emitting layer in the WOLED shown in FIG. 4.

Please refer to FIG. 5, and also refer to FIG. 4. FIG. 5 illustrates a relationship diagram of the color temperature, the intensity and the wavelength of the blue light-emitting layer in the WOLED shown in FIG. 4. As shown in FIG. 5, when the driving current of the blue light-emitting layer is A1 (I=A1 Am/cm$^2$), the color temperature of the blue light-emitting layer is about 2421 K. When the driving current of the blue light-emitting layer is A2 (I=A2 Am/cm$^2$) (A2>A1), the color temperature of the blue light-emitting layer is about 3150 K. It is understood that, by controlling the second voltage V2 or the driving current of the blue light-emitting layer, the color temperature of the blue light emitting layer 20 can be adjusted, as well as the color temperature of the WOLED.

In light of above, the WOLED in the present invention includes the blue light-emitting diode and the blue-complementary light-emitting diode (such as a RGOLED or a YOLED) which are stacked with each other. By using different driving current to drive the blue light-emitting diode and the blue-complementary light-emitting diode separately, the WOLED can provide white light without using three different OLEDs that emit different colors. By using different driving currents to separately drive the blue light-emitting diode and the blue-complementary light-emitting diode, the light emitting output of the blue light-emitting diode and the blue-complementary light-emitting diode can be optimized and the color temperature of the WOLED can be tunable, thereby solving the problem of color temperature shifting in conventional WOLEDs and improving the application of the WOLEDs.

Those skilled in the art will readily observe that numerous modifications and alterations of the device and method may be made while retaining the teachings of the invention.

What is claimed is:

1. A white organic light-emitting diode disposed on a substrate, the white organic light-emitting diode comprising:
   a transparent electrode;
   a red-green light-emitting layer emitting a red-green light being disposed on the transparent electrode;
   a translucent electrode disposed on the red-green light-emitting layer, wherein a first voltage is applied between the translucent electrode and the red-green light-emitting layer;
   a blue light-emitting layer emitting a blue light being disposed on the translucent electrode; and
   a non-transparent electrode disposed on the blue light-emitting layer, wherein an optical micro-cavity corresponding to a wavelength of blue light emitted by the blue light-emitting layer is formed between the translucent electrode and the non-transparent electrode, the micro-cavity is a semi-closed cavity, and one end of the micro-cavity is completely closed, wherein a second voltage is applied between the translucent electrode and the non-transparent electrode.

2. The white organic light-emitting diode of claim 1, wherein a material of the translucent electrode comprises silver, aluminum, gold, magnesium or combinations thereof.

3. The white organic light-emitting diode of claim 1, wherein a sheet resistance of the translucent electrode is substantially between 0.1 Ω/square and 10 Ω/square.

4. The white organic light-emitting diode of claim 1, wherein the first voltage between the transparent electrode and the translucent electrode is different from the second voltage between the non-transparent and the translucent electrode.

5. The white organic light-emitting diode of claim 1, wherein the translucent electrode is grounding and a thickness of the translucent electrode is substantially between 10 nm and 40 nm.

6. The white organic light-emitting diode of claim 1, further comprising a hole injection layer and a hole transmission layer disposed between the transparent electrode and the translucent electrode.

7. The white organic light-emitting diode of claim 1, further comprising a hole blocking layer and an electron injection layer disposed between the transparent electrode and the translucent electrode.

8. The white organic light-emitting diode of claim 1, further comprising a hole injection layer and a hole transmission layer disposed between the non-transparent electrode and the translucent electrode.

9. The white organic light-emitting diode of claim 1, further comprising a hole blocking layer and an electron injection layer disposed between the non-transparent electrode and the translucent electrode.

10. The white organic light-emitting diode of claim 1, wherein the red-green light emitted by the red-green light-emitting layer comprises a maximum intensity light having a wavelength being substantially greater than 490 nm.

11. The white organic light-emitting diode of claim 1, wherein the blue light emitted by the blue light-emitting layer comprises a maximum intensity light having a wavelength being substantially between 400 nm and 480 nm.

12. The white organic light-emitting diode of claim 1, wherein a thickness of the blue light-emitting layer is substantially less than 120 nm.

13. A white organic light-emitting diode disposed on a substrate, the white organic light-emitting diode comprising:
   a transparent electrode;
   a blue-complementary light-emitting layer emitting a blue-complementary light being disposed on the transparent electrode;
   a translucent electrode disposed on the blue-complementary light-emitting layer, wherein a first voltage is applied between the translucent electrode and transparent electrode;
   a blue light-emitting layer emitting a blue light being disposed on the translucent electrode, wherein the blue-complementary light is complementary to the blue light; and
   a non-transparent electrode disposed on the blue light-emitting layer, wherein an optical micro-cavity corresponding to a wavelength of the blue light emitted by the blue light-emitting layer is formed between the translucent electrode and the non-transparent electrode, the micro-cavity is a semi-closed cavity, and one end of the micro-cavity is completely closed, wherein a second voltage is applied between the translucent electrode and the non-transparent electrode.

14. The white organic light-emitting diode of claim 13, wherein a material of the translucent electrode comprises silver, aluminum, gold, magnesium or combinations thereof.

15. The white organic light-emitting diode of claim 13, wherein a sheet resistance of the translucent electrode is substantially between 0.1 Ω/square and 10 Ω/square.

16. The white organic light-emitting diode of claim 13, wherein the first voltage between the transparent electrode and the translucent electrode is different from the second voltage between the non-transparent and the translucent electrode.

17. The white organic light-emitting diode of claim 13, wherein the translucent electrode is grounding and a thickness of the translucent electrode is substantially between 10 nm and 40 nm.

18. The white organic light-emitting diode of claim 13, wherein the blue-complementary light emitted by the blue-complementary light-emitting layer comprises a maximum intensity light having a wavelength being substantially greater than 510 nm.

19. The white organic light-emitting diode of claim 13, wherein the blue light emitted by the blue light-emitting layer comprises a maximum intensity light having a wavelength being substantially between 400 nm and 480 nm.

20. The white organic light-emitting diode of claim 13, wherein a thickness of the blue light-emitting layer is substantially less than 120 nm.

21. The white organic light-emitting diode of claim 13, wherein the blue-complementary light-emitting layer is a yellow light-emitting layer.

22. The white organic light-emitting diode of claim 13, wherein the blue-complementary light-emitting layer is a red-green light-emitting layer.

23. The white organic light-emitting diode of claim 1, wherein the substrate comprises a concave, and the transparent electrode is disposed on the concave of the substrate.

24. The white organic light-emitting diode of claim 13, wherein the substrate comprises a concave, and the transparent electrode is disposed on the concave of the substrate.

25. A white organic light-emitting structure, comprising:
   a substrate comprising a concave;
   a transparent electrode disposed on the concave of the substrate;
   a red-green light-emitting layer disposed on the transparent electrode;
   a translucent electrode disposed on the red-green light-emitting layer, wherein a first voltage is applied between the translucent electrode and the red-green light-emitting layer;
   a blue light-emitting layer disposed on the translucent electrode; and
   a non-transparent electrode disposed on the blue light-emitting layer, wherein an optical micro-cavity corresponding to a wavelength of blue light emitted by the blue light-emitting layer is formed between the translucent electrode and the non-transparent electrode, and the micro-cavity is a semi-closed cavity, and one end of the micro-cavity is completely closed, wherein a second voltage is applied between the translucent electrode and the non-transparent electrode.

* * * * *